United States Patent [19]

Sakakibara et al.

[11] Patent Number: 4,758,535

[45] Date of Patent: Jul. 19, 1988

[54] METHOD FOR PRODUCING SEMICONDUCTOR LASER

[75] Inventors: Yasushi Sakakibara; Yasuo Nakajima; Hirofumi Namizaki, all of Itami, Japan

[73] Assignee: Mitsubishi Denki Kabushiki Kaisha, Tokyo, Japan

[21] Appl. No.: 26,274

[22] Filed: Mar. 16, 1987

[30] Foreign Application Priority Data

May 31, 1986 [JP] Japan ................................. 61-126506

[51] Int. Cl.⁴ .................... H01L 21/20; H01L 21/203; H01L 21/205
[52] U.S. Cl. .................................... 437/129; 372/45; 372/46; 372/48; 372/50; 156/647; 357/17
[58] Field of Search ........................ 156/647, 652, 656; 372/45, 46, 48, 50; 357/17; 29/569 L; 437/129

[56] References Cited

U.S. PATENT DOCUMENTS

| | | | |
|---|---|---|---|
| 4,002,997 | 1/1977 | Thompson | 372/46 |
| 4,282,494 | 8/1981 | Yonezu et al. | 372/46 |
| 4,285,763 | 8/1981 | Coldren | 156/646 |
| 4,354,898 | 10/1982 | Coldren et al. | 29/569 L |
| 4,439,268 | 3/1984 | Coldren et al. | 156/647 |
| 4,496,403 | 1/1985 | Turley | 29/569 L |
| 4,546,481 | 10/1985 | Yamamoto et al. | 372/48 |
| 4,573,255 | 3/1986 | Gordon et al. | 372/46 |
| 4,595,454 | 6/1986 | Dautremont-Smith et al. | 29/569 L |
| 4,644,552 | 2/1987 | Ohshima et al. | 372/45 |
| 4,660,208 | 4/1987 | Johnston, Jr. et al. | 372/46 |
| 4,661,960 | 4/1987 | Hirayama et al. | 372/46 |
| 4,675,710 | 6/1987 | Ishikawa et al. | 372/46 |

FOREIGN PATENT DOCUMENTS

| | | | |
|---|---|---|---|
| 0123189 | 9/1980 | Japan | 372/48 |
| 0128783 | 8/1983 | Japan | 372/48 |
| 0178582 | 10/1983 | Japan | 372/46 |
| 0207690 | 12/1983 | Japan | 372/46 |
| 0220486 | 12/1983 | Japan | 372/48 |
| 0112673 | 6/1984 | Japan | 372/48 |
| 0175783 | 10/1984 | Japan | 372/48 |
| 0128691 | 7/1985 | Japan | 372/46 |
| 0235484 | 11/1985 | Japan | 372/48 |

OTHER PUBLICATIONS

Ishikawa et al., "V-Grooved Substrate Buried Heterostructure InGaAsP/InP Laser by One-Step," *J. Appl. Phys.*, 53(4), Apr. 1982, pp. 2851–2853.

Fielder et al., "Material-Selective Etching of InP and an InGaAsP Alloy," *J. of Matls. Sci.*, 17, (1982), pp. 2911–2918.

Journal of Lightwave Technology, vol. LT-3, No. 5, published on Oct., 1985, "High Power 1.3-μm InGaAsP P-Substrate Buried Crescent Lasers".

Technical Digest of the Conf. on Lasers and Electro-Optics CLEO '85, published on May 23, 1985, "TH13 Comparison of Catastrophic Degradation Levels in AlGaAs Window Lasers and Nonwindow Lasers After Long-Term Operation".

*Primary Examiner*—Brian E. Hearn
*Assistant Examiner*—Mary Wilczewski
*Attorney, Agent, or Firm*—Oblon, Fisher, Spivak, McClelland & Maier

[57] ABSTRACT

A method for producing a semiconductor laser of InGaAsP/InP type having a structure, in which an active layer isolated from outside is embedded in a groove in a substrate wafer, which comprises steps of: forming the groove in the substrate having a crystallographic plane of (100), on the upper surface of which a current blocking layer has been formed, along the <011> direction of the substrate, in a manner to be terminated at both sides of substrate wafer in the vicinity of the end faces of a laser resonator; and, thereafter, sequentially forming on the groove and other regions of the substrate clad layers and the active layer.

7 Claims, 4 Drawing Sheets

METHOD FOR PRODUCING SEMICONDUCTOR LASER

BACKGROUND OF THE INVENTION

1. Field of the Invention

This invention relates to a method for production of an InGaAsP/InP type semiconductor laser having high output power and high operational reliability.

2. Discussion of Background

There has so far been known a high output power laser of an InGaAsP/InP type having a structure as shown in FIG. 5 of the accompanying drawing. In the drawing, a reference numeral 1 designates a p-type InP substrate, a numeral 2 refers to an n-type InP current blocking layer, a numeral 3 refers to a p-type InP current blocking layer, 4 denotes a p-type InP clad layer, 5 designates an InGaAsP active layer, 6 refers to an n-type InP clad layer, and 7 represents an n-type InGaAsP contact layer.

This laser is fabricated by the crystal growth for two times on the p-type InP substrate 1 having the crystallographic plane of (100). In the first crystal growth, the n-type InP current blocking layer 2, the p-type InP current blocking layer 3, and a thin layer of InGaAsP (not shown in the drawing) having a thickness of 0.2 μm or so and to be used as an etching mask are grown on the p-type InP substrate in the order as mentioned. By the way, a p-type InP buffer layer (not shown in the drawing) is usually grown between the p-type InP substrate 1 and the n-type InP current blocking layer 2, this buffer layer being for reduction in influence of the strain onto the epitaxial layer of the p-type InP substrate 1.

In the next place, a stripe pattern having a width of about 1 to 2 μm is formed along the <011> direction of the crystallographic plane (100) of the crystal which has completed its initial growth, and then a groove having a shape of arrowhead in its cross-section is formed with use of hydrochloric acid type etching solution and the InGaAsP layer as the mask, the tip end of the groove piercing through the n-type InP current blocking layer 2. Subsequently, as the second crystal growth, there are sequentially formed the p-type InP clad layer 4, the InGaAsP active layer 5, the n-type InP clad layer 6, and the n-type InGaAsP contact layer 7. The InGaAsP active layer 5 is grown in the arrowhead-shaped groove along the <011> direction of its crystallographic plane (100) in the cross-sectional shape of a crescent.

In this type of laser, the InGaAsP active layer 5 in the crescent shape is formed in the groove of a narrow width, and is enclosed by an InP crystal having its refractive index lower than that of the InGaAsP active layer 5, on account of which it constitutes a refractive index wave-guide type laser capable of performing stable fundamental transverse mode oscillation. Further, a reverse bias junction between the n-type InP current blocking layer 2 and the p-type InP current blocking layer 3, both being formed on the p-type InP substrate 1, has high breakdown voltage. Therefore, when this laser is biased in the forward direction to cause electric current to flow, it functions to suppress with extremely high effectiveness the leakage current flowing outside the InGaAsP active layer 5. As the result of this, the laser is capable of performing its oscillation at a low threshold value of from 10 to 20 mA or so, and also of carrying out a high output operation of 50 mW or more in its continuous operation. It is further excellent in its high temperature operation, i.e., it is capable of operating even at such a temperature as high as 100° C. or above.

While the conventional high output power laser of the InGaAsP/InP type as described above is capable of performing the high output power operations, it has a point of problem such that, since the InGaAsP active layer 5 is exposed to the end face of the laser resonator, the InGaAsP active layer 5 tends to readily bring about oxidation on its surface with the consequence that its operational reliability at the high output power operation is not satisfactory.

SUMMARY OF THE INVENTION

The present invention has been made with a view to solving such point of problem inherent in the conventional semiconductor laser, and aims at providing the method for producing the semiconductor laser having high operating reliability even at the high output power operation.

According to the present invention in general aspect of it, there is provided a method for producing a semiconductor laser of an InGaAsP/InP type having a structure, in which an active layer isolated from outside is embedded in a groove of a substrate wafer, said method being characterized in that said groove is formed in said substrate wafer having a crystallographic plane of (100), on the upper surface of which a current blocking layer has been formed, along the <001> direction of the crystallographic plane (100), in a manner to be terminated at both sides of said substrate wafer in the vicinity of the end faces of a laser resonator, and that, thereafter, clad layers and the active layer are sequentially formed on the groove and the other portions of said substrate.

The foregoing object, other objects as well as specific construction and function of the semiconductor laser according to the present invention will become more apparent and more readily understandable from the following detailed description thereof, when read in conjunction with the accompanying drawing.

BRIEF DESCRIPTION OF THE ACCOMPANYING DRAWING

In the drawing:

FIG. 1 is a perspective view showing one embodiment of a part corresponding to one chip of a wafer for use in the method of producing the semiconductor laser according to the present invention;

FIGS. 2(a), 2(b) and 2(c) are respectively cross-sectional views of the wafer shown in FIG. 1, taken along the lines A-A', B-B' and C-C';

FIG. 3 is a perspective view showing one embodiment of the semiconductor laser produced by the method of the present invention;

FIGS. 4(a), 4(b) and 4(c) are respectively cross-sectional views of the semiconductor laser shown in FIG. 3, taken along the lines A-A', B-B' and C-C'; and FIG. 5 is a perspective view showing a structure of a conventional high output power laser.

DETAILED DESCRIPTION OF PREFERRED EMBODIMENTS

In the present invention, the crystal growth readily takes place from the crystallographic planes of (11$\bar{1}$) and (1$\bar{1}$1) at the bottom part of the groove formed in the substrate, but no crystal growth takes place from the (111) plane and the (1$\bar{1}\bar{1}$) plane at both ends in the direction of <011> in the groove; on the other hand, the active layer is formed in the groove where there is such groove, and, at a position in the vicinity of the end faces of a laser resonator, it is separated from the active layer in the groove, and formed in the substrate at a level higher than that where the laser beam is guided.

More detailed explanations will be given with reference to the best mode to practice the present invention as shown in FIGS. 1 to 4.

Figure 1:
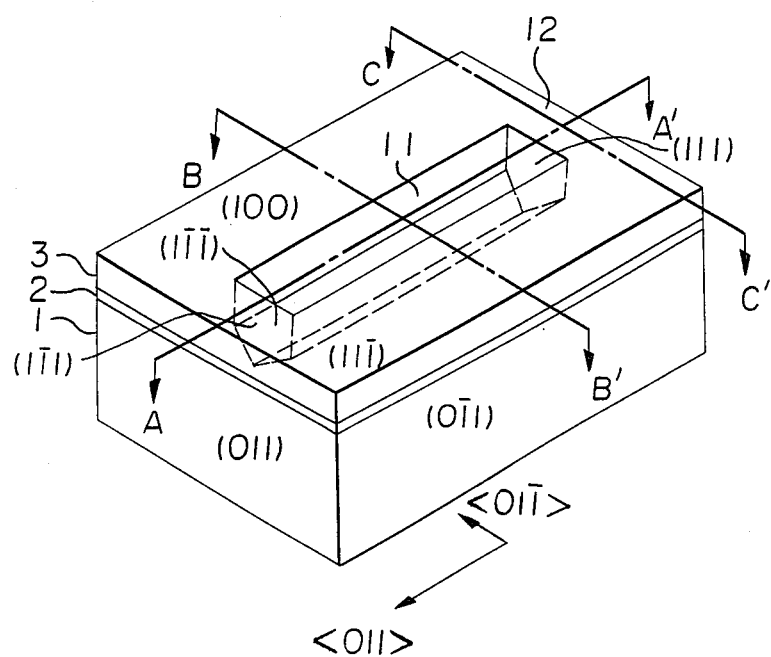
Figure 5:
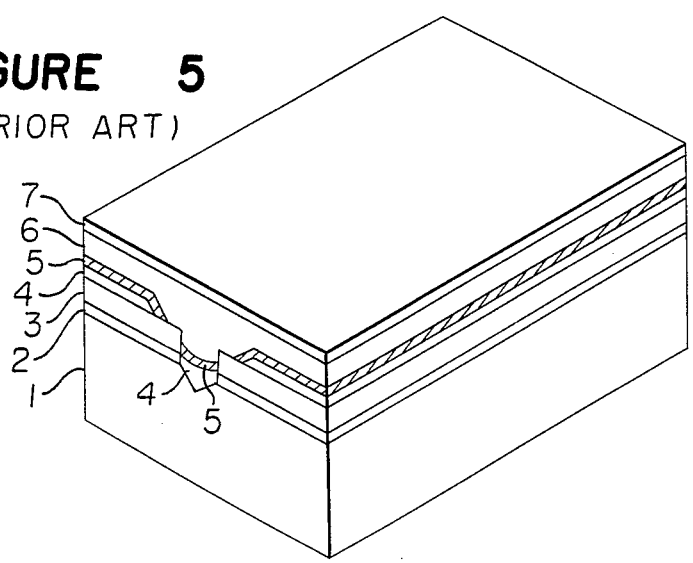

FIG. 1 is a perspective view showing one embodiment of a part corresponding to one chip of a wafer to be used in the manufacture of the semiconductor laser according to the present invention. In the drawing, the same parts as in FIG. 5 are designated by the same reference numerals. A reference numeral 11 designates a groove in the shape of an arrowhead, the tip end of which pierces through the n-type InP current blocking layer 2, and a numeral 12 refers to a portion of the above-mentioned p-type InP current blocking layer 3 where no groove is formed.

In this embodiment, same as the conventional semiconductor laser, the n-type InP current blocking layer 2 and the p-type InP current blocking layer 3 are formed on the (100) plane of the p-type InP substrate 1 by the first crystal growth, and then the groove 11 is formed along the <011> direction, reaching the neighborhood of the end faces of the laser resonator at both ends of the substrate.

Figure 2A:
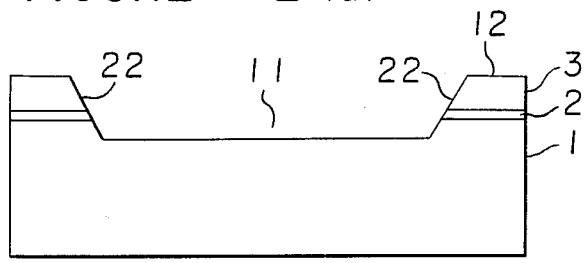
Figure 2B:
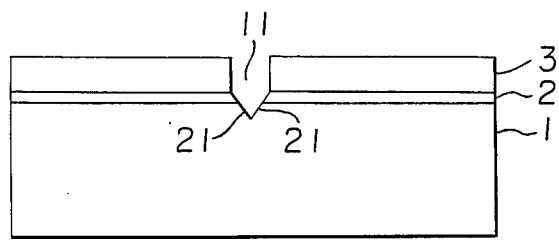
Figure 2C:
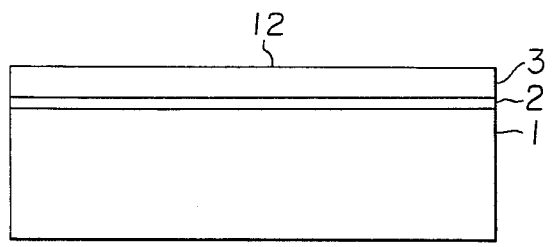

FIGS. 2(a), 2(b) and 2(c) illustrate respectively the cross-sectional views of the wafer shown in FIG. 1, taken along the lines A-A', B-B' and C-C' therein. In these figures of the drawing, a reference numeral 21 designates the crystallographic planes of (11$\bar{1}$) and (1$\bar{1}$1) of the InP crystal on the bottom inner surface of the above-mentioned groove 11, and a numeral 22 refers to the crystallographic planes of (111) and (1$\bar{1}\bar{1}$) of the InP crystal on both end surfaces of the above-mentioned groove 11 in the <011> direction.

Figure 3:
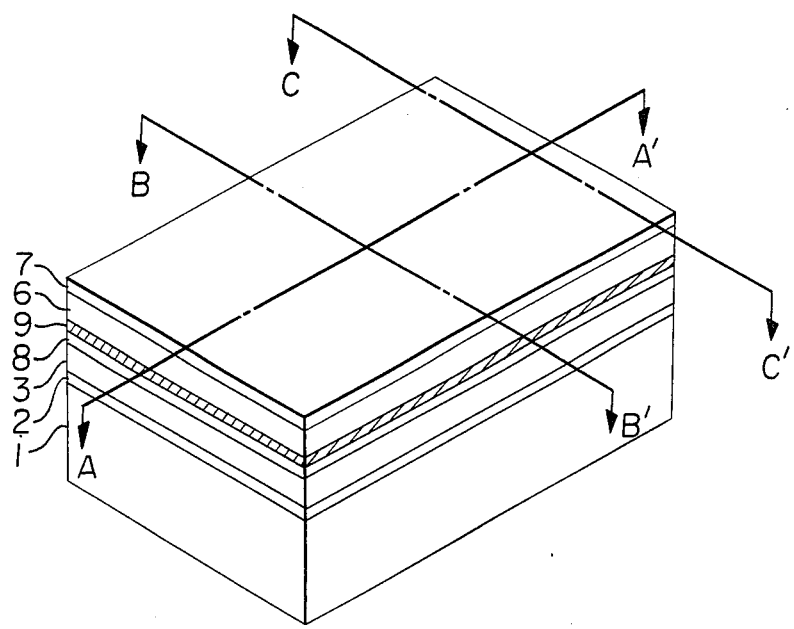

Subsequently, during the second crystal growth, the p-type InP clad layer 4, the InGaAsP active layer 5, the n-type InP clad layer 6, and the n-type InGaAsP contact layer 7 are sequentially formed on a region of the substrate wafer where the groove 11 is provided as well as on other region 12 thereof where no groove is formed, as shown in FIG. 1, whereby the semiconductor laser of the structure as shown in FIG. 3 can be fabricated.

In FIG. 3, the same reference numerals as in FIGS. 1, 2 and 5 designate the same parts, in which a numeral 8 refers to the p-type InP clad layer formed outside the groove 11, and a reference numeral 9 denotes the InGaAsP active layer also formed outside the groove 11. The cross-sectional views of this semiconductor laser taken along the lines A-A', B-B' and C-C' in FIG. 3 are respectively illustrated in FIGS. 4(a), 4(b) and 4(c).

Figure 4A:
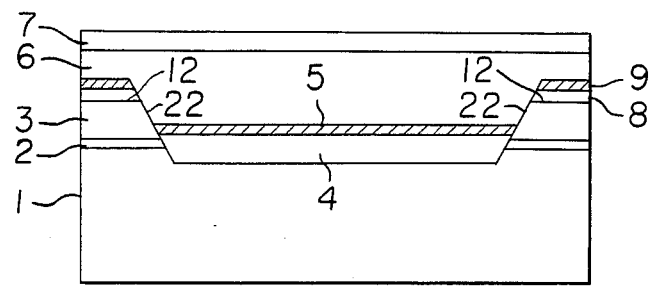
Figure 4B:
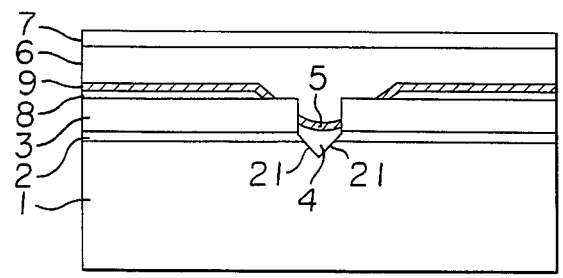
Figure 4C:
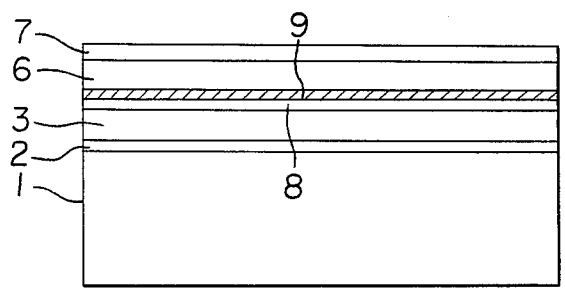

That is to say, the crystal growth to the portion of the wafer shown in FIG. 1 where the groove 11 has been formed is effected in such a manner that it may take a cross-sectional shape as shown in FIG. 4(b), which is the same structure as that of the conventional semiconductor laser.

Moreover, owing to the fact that the groove 11 has been formed along the <011> direction of the crystal having the crystallographic plane of (100), the bottom surface of the groove 11, as viewed in FIG. 4(b), has the crystallographic planes 21 of (11$\bar{1}$) and (1$\bar{1}$1) of the InP crystal. On account of this, when the p-type InP clad layer 4 is to be grown, the crystal growth tends to occur readily from the planes 21 of (11$\bar{1}$) and (1$\bar{1}$1), whereby the InGaAsP active layer 5 becomes embedded in the groove 11 with a crescent cross-section.

On the other hand, the longitudinal cross-section A-A' of the laser as grown will have a structure as shown in FIG. 4(a), wherein the inclined surfaces at both ends of the groove 11 along the <011> direction shown in FIG. 2(a) will have the crystallographic planes of (111) and (1$\bar{1}\bar{1}$). With the InP type semiconductor, however, when the crystal growth is effected on the InP substrate having the crystallographic planes of (111) and (1$\bar{1}\bar{1}$), no crystal growth occurs from the planes 22 of (111) and (1$\bar{1}\bar{1}$), but it grows sequentially from the lower surface. On account of this, the p-type InP clad layers 4, 8 and the InGaAsP active layers 5, 9 are not connected at both end parts of the groove 11, respectively, but a flat and smooth growth can be effected. As the consequence of this, the semiconductor laser according to the present invention has its structure such that the waveguide path formed with the InGaAsP active layer 5 is disconnected at both ends of the groove 11, and the outer side of the groove 11 is constructed with the InP crystal having a broader forbidden band than the InGaAsP active layer 5, hence the resulting semiconductor laser has a window structure. As the result, even if this semiconductor laser is subjected to electric conduction over a long period of time, no deterioration takes place on the end faces of the laser resonator, hence the optical destruction level does not become low. In addition, this laser has its principal part at the cross-sectional structure as shown in FIG. 4(b), with which a high output power operation as equal as that of the conventional semiconductor laser is possible.

Incidentally, in the above-described embodiment of the present invention, the groove 11 formed along the <011> direction of the wafer is shown to have its cross-sectional shape of the arrowhead. It is however possible, of course, that the groove 11 has a V-shaped cross-section. Further, as the current blocking layer for the wafer, in which the groove 11 is formed, there is shown a construction wherein a reverse pn-junction is used. It may, of course, be possible that this portion is a high resistivity layer such as a semi-insulating layer.

As has so far been described, the characteristic feature of the present invention resides in that a groove is formed along the <011> direction of the substrate having its crystallographic plane of (100) in a manner to terminate in the vicinity of the end face of a resonator, whereby, at the time of forming the active layer, the groove has the crystallographic planes of (111) and (1$\bar{1}\bar{1}$) at both ends [FIG. 4(a)], with the consequent disconnection to occur in the active layer between the interior of the groove and the exterior thereof in the course of the crystal growth. While, in the plane parallel to the end faces of the resonator, since the width of the groove is as narrow as 1 to 2 μm or so, disconnection takes place naturally in the active layer [FIG. 4(b)], with the consequent active layer is entirely embedded in the groove. Therefore, in the present invention, the direction of forming the groove is set in the <011> direction with a view to obtaining this disconnection in the course of the crystal growth. On account of this, there accrues a resulting effect such that the semiconductor laser of the window structure having high operating reliability even during a high output operation can be readily obtained.

Although, in the foregoing, the present invention has been described in specific details with reference to a couple of preferred embodiments thereof, it should be noted that any changes and modifications may be made by those persons skilled in the art within the ambit of the present invention as recited in the appended claims.

What is claimed is:

1. A method for producing a semiconductor laser of the InGaAsP/InP type having a structure in which an active layer, isolated form outside, is embedded in a groove in a substrate wafer, said method comprising the steps of:

forming a current blocking layer on the upper surface of said substrate wafer wherein said substrate has a crystallographic plane of (100);

forming said groove in said substrate along the {011} direction of the substrate, wherein said groove extends form substantially one side of said substrate to substantially another side of said substrate in such a manner that said groove terminates before both end faces of a laser resonator wherein each of said sides correspond to the end faces of a laser resonator; and sequentially forming, on said groove and the remainder of said substrate, clad layers and said active layer.

2. A method for producing a semiconductor laser according to claim 1, wherein use is made of a p-type InP substrate as the substrate having the crystallographic plane of (100).

3. A method for producing a semiconductor laser according to claim 1, wherein, as the current blocking layer, use is made of an n-type InP current blocking layer and a p-type InP current blocking layer.

4. A method for producing a semiconductor laser according to claim 1, wherein, as the current blocking layer, use is made of an InP semi-insulating layer.

5. A method for producing a semiconductor laser according to claim 1, wherein said groove has a shape of an arrowhead in its cross-section.

6. A method for producing a semiconductor laser according to claim 1, wherein said groove has a shape of a letter "V" in its cross-section.

7. A method for producing a semiconductor laser according to claim 1, wherein said groove has a width of approximately 1–2 microns.

* * * * *